United States Patent [19]

Maeda

[11] Patent Number: 4,459,545

[45] Date of Patent: Jul. 10, 1984

[54] APPARATUS FOR DETECTING A CURRENT PEAK VALUE AND A VOLTAGE PEAK VALUE

[75] Inventor: Koji Maeda, Hyogo, Japan

[73] Assignee: Mitsubishi Denki Kabushiki Kaisha, Tokyo, Japan

[21] Appl. No.: 277,506

[22] Filed: Jun. 26, 1981

[30] Foreign Application Priority Data

Jun. 30, 1980 [JP] Japan ................................ 55-90106

[51] Int. Cl.³ .................... G01R 19/16; G01R 31/08
[52] U.S. Cl. ................................. 324/103 P; 324/52
[58] Field of Search ................ 324/103 P, 111, 52; 364/482, 492

[56] References Cited

U.S. PATENT DOCUMENTS

3,931,502  1/1976  Kohlas .............................. 324/52
4,281,386  7/1981  Kondow et al. ................... 324/52

Primary Examiner—Ernest F. Karlsen
Attorney, Agent, or Firm—Sughrue, Mion, Zinn, Macpeak, and Seas

[57] ABSTRACT

An apparatus for detecting a voltage peak value and a current peak of value and for detecting the amount of time or phase angle deviation between the voltage peak of value and current peak point to thereby locate a fault in a power line system. A decision circuit detects a sampling number indicating the peak point. The output of the decision circuit is applied to counter circuits while the number of sampling times is counted according to a preset sampling period. The operation of the counter is stopped by an output signal from the decision circuit to thereby output a digital number representing how many sampling numbers correspond to the distance between the peak points of the voltage and current.

5 Claims, 9 Drawing Figures

APPARATUS FOR DETECTING A CURRENT PEAK VALUE AND A VOLTAGE PEAK VALUE

BACKGROUND OF THE INVENTION

The present invention relates to an apparatus for detecting a voltage peak value and a current peak value. More particularly, the invention relates to an apparatus for detecting the amount of time and phase angle deviation between a voltage peak point and a current peak point for use in a digital processing type fault locator in which analog electrical data is converted into digital electrical data. The fault located is used to locate a faulty point on a transmission line, i.e. to determine the distance of a trouble point from a substation or the like.

If, in a conventional fault point locating method, the resistance between a fault point and the location of a fault locator position is represented by r, the inductance therebetween by l, the fault current flowing towards the fault point from a power source by i, and the present voltage at the position of the fault locator (hereinafter referred to as "a locator point" when applicable) by v, and if the ground charging current is disregarded because it is much smaller than the fault current, then the above-described factors can be related to one another by the following relation:

$$v = ri + l\frac{di}{dt}. \tag{1}$$

The right side equation (1) has a term necessitating differential calculation; that is, it must be subjected to numeral differentiation when the equation is numerically evaluated. Accordingly, if the input changes abruptly, the calculation error is generally high. Therefore, in general, data represented by the following equation (2), which is obtained by integrating equation (1) with respect to time t is employed:

$$\int_{t_1}^{t_2} v\,dt = r\int_{t_1}^{t_2} i\,dt + l\,[i]_{t_1}^{t_2}. \tag{2}$$

Figure 1:
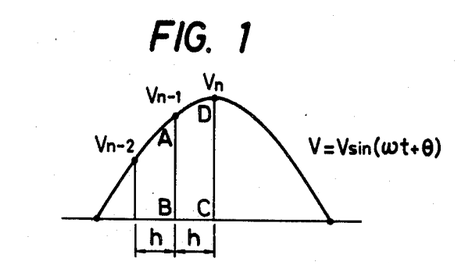
FIG. 1 is an explanatory diagram for a description of the principle of a digital numerical integration.

This will be described with reference to a digital processing type locator. FIG. 1 shows a waveform which illustrates a principle of evaluating the expression (2) with digital data. Specifically, FIG. 1 indicates a procedure of numeral integration with respect to a voltage waveform by way of example. In FIG. 1, reference character h designates a sampling time width. The waveform is represented by:

$$v = V\sin(\omega t + \theta) \tag{3}$$

The instantaneous value of the expression (3) sampled at a time instant t is represented by:

$$v_n = V\sin(\omega t + \theta) \tag{4}$$

Instantaneous values sampled one and two sampling times before the instantaneous value $v_n$ are represented respectively by:

$$v_{n-1} = V\sin\{\omega(t-h)+\theta\}, \text{ and} \tag{5}$$

$$v_{n-2} = V\sin\{\omega(t-2h)+\theta\}. \tag{6}$$

If in the expression (2)

$$t_2 = t \text{ and } t_1 = t-h, \tag{7}$$

then it is evident that the figure ABCD, which is a part of the sinusoidal waveform, corresponds to the left side of the expression (2). Therefore, when the value h is sufficiently small, applying the trapezoidal formula, the area can be approximated as follows:

$$\int_{t_1}^{t_2} i\,dt = (v_n + v_{n-1}) \cdot \frac{h}{2}. \tag{8}$$

By similarly approximating equation (2), the following expression (9) and (10) can be obtained for the current:

$$(v_n + v_{n-1}) \cdot \frac{h}{2} = (i_n + i_{n-1}) \cdot \frac{rh}{2} + l(i_n - i_{n-1}), \tag{9}$$

and $$v_n + v_{n-1} = r(i_n + i_{n-1}) + \frac{2l}{h}(i_n - i_{n-1}). \tag{10}$$

In general, the following expression (11) corresponding to the expression (10) is obtained by shifting the sampling time:

$$v_{n-1} + v_{n-2} = r(i_{n-1} + i_{n-2}) + \frac{2l}{h}(i_{n-1} - i_{n-2}). \tag{11}$$

From the expressions (10) and (11), the following expression (12) is obtained:

$$l \approx \frac{\begin{vmatrix} i_n + i_{n-1} & v_n + v_{n-1} \\ i_{n-1} + i_{n-2} & v_{n-1} + v_{n-2} \end{vmatrix}}{\begin{vmatrix} i_n + i_{n-1} & i_n - i_{n-1} \\ i_{n-1} + i_{n-2} & i_{n-1} - i_{n-2} \end{vmatrix}} \times \frac{h}{2}. \tag{12}$$

There are serious drawbacks accompanying a conventional locator including:

(1) During the occurrence of a fault in the system, the voltage leads the fault current i by about 90° (practically, the former will not lead the latter about 90° because of the resistance at the fault point);

(2) The effect of a quantization error cannot be neglected because digital data is used;

(3) For relatively short transmission lines, upon occurrence of transmission line troubles, in general, the current tends to increase while the voltage tends to decrease; and (4) If one of the data points used for numerically evaluating the expression (12) is near the peak point thereof, the other data point will be near the zero crossing point. This leads to an increase in the quantization error which is turn lowers the overall accuracy of the fault locator system.

In view of the foregoing, an object of the invention is to provide a method of decreasing the effect of a quantization error in a digital processing type fault locator by improving the calculation method.

The expressions (4) through (6) represent instantaneous values as described above. If these data values are converted into digital data by an A/D (analog-to-digital) converter, typically the expression (4) can be rewritten as follows:

$$v_n = v\{\sin(\omega t + \theta) + (\epsilon/V)\}, \quad (13)$$

where $\epsilon$ is the resolution of the A/D converter which determines the quantization error. Once the dynamic range and the number of bits of the A/D converter are determined, the resolution $\epsilon$ determining the quantization error is determined as a constant. For instance, in the employment of an A/D converter having a dynamic range of $\pm 10$ V and having twelve bits including one sign bit, the resolution per bit is:

$$\epsilon = \frac{10 \text{ V}}{2^{12}} = 2.44 \text{ mV} \quad (14)$$

If an input current of $200\sqrt{2}$ A and a voltage of $110\sqrt{2}$ V are scaled to a dynamic range of 10 V, resolutions $\epsilon_I$ and $\epsilon_V$ determining quantization errors with respect to the current and the voltage are:

$$\epsilon_I = 69.1 \text{ mA, and} \quad (15)$$

$$\epsilon_V = 38.0 \text{ mV}. \quad (16)$$

Thus, quantization errors of about 5% and about 3%, respectively, are present for a current having a peak value of $\sqrt{2}$ A and a voltage having a peak value $\sqrt{2}$ V.

As is apparent from the expression (13), when the inputs I and V are both low, the errors and steps of resolutions with respect to the amplitudes of the inputs are high. Furthermore, even if with respect to one of the voltage V and the current A the data value corresponding to a time instant $t-h$ is at a peak, $\theta$ is about 90°, and therefore the other data value is near the zero value. Thus, the effect of the relative error cannot be neglected.

SUMMARY OF THE INVENTION

In accordance with the invention, the characteristic in a low input range is improved. In other words, even in the case when the voltage or current is forced to have a value close to the zero crossing value, the effect of the relative error due to the resolution is decreased as much as possible.

More specifically, the invention provides an apparatus for detecting a current peak value and a voltage peak value in a power line system. The apparatus includes first memory means for storing a digital signal representing a current obtained by sampling a current flowing through the power line system at a predetermined time interval. First subtracting means determines a difference between a present sampling data point and a sampling data point corresponding to a sampling time prior to that for the present sampling data point with the sampling data point corresponding to a sampling time before the present sampling data point being stored in the first memory means. First multiplication means produces a product of the present sampling data point and a first constant. The product output of the first multiplication means and a content of the first memory means are compared by a first comparing means. First decision means detects changes of signs in the outputs of the first comparison means and the first subtracting means. Second memory means stores a digital voltage signal obtained by sampling a voltage appearing in the power line system at a predetermined time interval. Second subtracting means determines a difference between the present sampling data point and a sampling data point sampled one sampling time prior to the present sampling data point with the former being stored in the first memory means. Second multiplication means determines a product of the present sampling data point and a second constant while second comparing means produces a second comparison result representing a comparison between the product output of the second multiplication means and the content of the second memory means. Second decision means detects changes of the signs in the outputs of the second comparing means and the second subtracting means.

First counting means operates by starting counting the number of samplings which have occurred in response to an output of the first decision means and stops counting in response to an output of the second decision means. Second counting means is operable so as to start counting the number of samplings in response to the output of the second decision means and to stop counting in response to the output of the first decision means. Third decision means provides an output representative of the number of samplings which have been carried out during a period of time defined by termination of the counting operation of the second counting means and an initial output of the first decision means. Fourth decision means produces an output representative of the number of samplings which have been carried out within a period of time defined by termination of the counting operation of the first counting means and an initial output of the second decision means.

DESCRIPTION OF THE PREFERRED EMBODIMENTS

Figure 2:
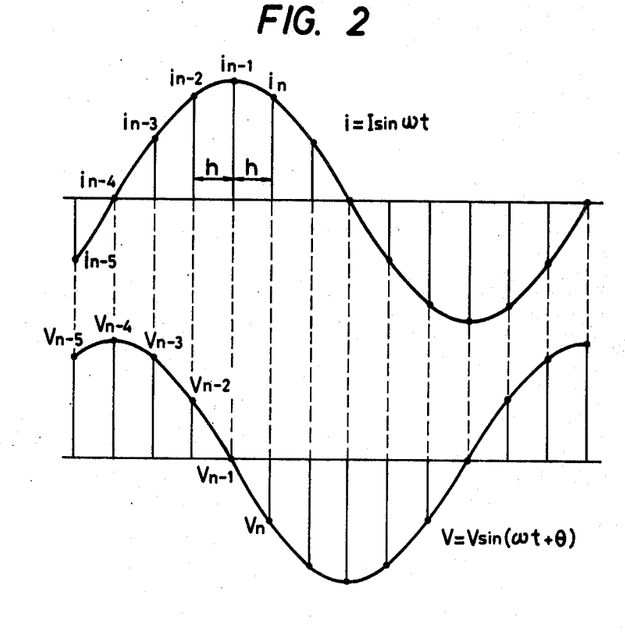
FIG. 2 is an explanatory diagram for a description of an operating principle of the invention.

FIG. 2 is a waveform diagram for illustrating the principles of the invention, showing a voltage v with a circuit i at the occurrence of a fault in a transmission line.

For convenience of description, the sampling time h is assumed to correspond to an electrical angle 30° (or 1.39 ms at 60 Hz). In addition, it is assumed that a method (described below) of obtaining current data points $i_n$, $i_{n-1}$ and $i_{n-2}$ close to the peak value is employed. In correspondence to these current data values, voltage data points $v_n$, $v_{n-1}$ and $v_{n-2}$, which are required for evaluating the expression (12), are assumed to be close to the zero crossing point in FIG. 2.

As in the case of the current i data, it is assumed that a method of obtaining voltage v data close to the peak value is employed. That is, the voltage v data values are sampled data points $v_{n-3}$, $v_{n-4}$ and $v_{n-5}$ which are taken before the data point $v_n$. Thus the expression (12) can be evaluated using these data points $i_n$, $i_{n-1}$ and $i_{n-2}$ and $v_{n-3}$, $v_{n-4}$ and $v_{n-5}$ with the relative error (or the quantization error effect) with respect to the input value due to the resolution decreased.

Thus, a feature of the invention is that, in correspondence to current data points $i_n$, $i_{n-1}$ and $i_{n-2}$ close to the peak value, instead of voltage data points $v_n$, $v_{n-1}$ and $$r' = \frac{\begin{vmatrix} v_n + v_{n-1} & i_n - i_{n-1} \\ v_{n-1} + v_{n-2} & i_{n-1} - i_{n-2} \end{vmatrix}}{\begin{vmatrix} i_n + i_{n-1} & i_n - i_{n-1} \\ i_{n-1} + i_{n-2} & i_{n-1} - i_{n-2} \end{vmatrix}} =$$

$$\frac{\sin\left\{\omega\left(t - \frac{h}{2}\right) + \theta\right\}\cos\omega\left(t - \frac{3h}{2}\right) - \sin\left\{\omega\left(t - \frac{h}{2}\right) + \theta\right\}\cos\omega\left(t - \frac{h}{2}\right)}{2\sin\omega h} \times \frac{V}{I} = Z\cos\theta$$

$v_{n-2}$ being used, which are relatively large in quantization error, past voltage data points $v_{n-3}$, $V_{n-4}$ and $v_{n-5}$ having a relatively small quantization error are used for the calculation.

In accordance with the invention, expression (12) can be evaluated as follows:

$$\frac{\begin{vmatrix} I\sin\omega t + I\sin\omega(t-h) & V\sin(\omega t - \theta) + V\sin\{\omega(t-h) + \theta\} \\ I\sin\omega(t-h) + I\sin\omega(t-2h) & V\sin\{\omega(t-h) + \theta\} + V\sin\{\omega(t-2h) + \theta\} \end{vmatrix}}{\begin{vmatrix} I\sin\omega t + I\sin\omega(t-h) & I\sin\omega t - I\sin\omega(t-h) \\ I\sin\omega(t-h) + I\sin\omega(t-2h) & I\sin\omega(t-h) - I\sin\omega(t-2h) \end{vmatrix}} \times \frac{h}{2} =$$

(17)

$$\frac{\begin{vmatrix} I\sin\omega\left(t - \frac{h}{2}\right)\cos\frac{\omega h}{2} & V\sin\left\{\omega\left(t - \frac{h}{2}\right) + \theta\right\}\cos\frac{\omega h}{2} \\ I\sin\omega\left(t - \frac{3h}{2}\right)\cos\frac{\omega h}{2} & V\sin\left\{\omega\left(t - \frac{3h}{2}\right) + \theta\right\}\cos\frac{\omega h}{2} \end{vmatrix}}{\begin{vmatrix} I\sin\omega\left(t - \frac{h}{2}\right)\cos\frac{\omega h}{2} & I\cos\omega\left(t - \frac{h}{2}\right)\sin\frac{\omega h}{2} \\ I\sin\omega\left(t - \frac{3h}{2}\right)\cos\frac{\omega h}{2} & I\cos\omega\left(t - \frac{3h}{2}\right)\sin\frac{\omega h}{2} \end{vmatrix}} \times \frac{h}{2} =$$

$$\frac{\cos(\omega h - \theta) - \cos\{2\omega(t-h) + \theta\} - \cos(\omega h + \theta) + \cos\{2\omega(t-h) + \theta\}}{\sin2\omega(t-h) + \sin\omega h - \sin2\omega(t-h) + \sin\omega h} \times \cos\frac{\omega h}{2} \times \frac{V}{I} \times \frac{h}{2} =$$

$$Z\sin\theta \cdot \frac{h}{2} \cdot \cot\frac{\omega h}{2} = \frac{Xh}{2} \cdot \cot\frac{\omega h}{2} = l\left(\frac{\omega h}{2} \cdot \cot\frac{\omega h}{2}\right) \approx l, \text{ where } Z = V/I, Z\sin\theta = X,$$

and $\frac{\omega h}{2} \cdot \cot\frac{\omega h}{2} = 0.977 \approx 1$ (for $h = 30°$).

From this it may be seen that the approximation error is very small, about 3/1000. For a more accurate value, 0.977 should be used as a coefficient.

For instance, if it is assumed that voltage data points $v_{n-k}$ produced by sampling k times correspond to current data points $i_n$ near the voltage peak value, and if similarly as in the evaluation of expression (17) calculation is carried using voltage data values $v_{n-k}$, $v_{n-k-1}$, $v_{n-k=2}$ and current data values $i_n$, $i_{n-1}$ and $i_{n-2}$ instead of data values $v_n$, $v_{n-1}$, $v_{n-2}$, $i_n$, $i_{n-1}$ and $i_{n-2}$, then the false inductance $l'$ is:

$$l' = Z\sin(\theta - \omega kh) \cdot \frac{h}{2} \cdot \cos\frac{\omega h}{2}. \tag{18}$$

That is, the measured inductance appears smaller by a factor of $$\frac{\sin(\theta - \omega kh)}{\sin\theta}.$$

Similarly as in the calculation of l from the expression (17), the false resistance $r'$ is obtained as follows:

(19)

Similarly as in the calculation of l' from the expression (18), the false resistance $r'$ can be obtained as follows:

$$r' = Z\cos(\theta - \omega kh). \tag{20}$$

Using $r'$ and $l'$ obtained from the expressions (18) and (20), respectively:

$$\frac{rh}{2}\cot\frac{\omega h}{2} = \cos\omega kh \cdot l' + \frac{h}{2}\cos\frac{\omega h}{2}\sin\omega kh \cdot r' l = \tag{21}$$

$$\cos\omega kh \cdot l' + \sin\omega kh \cdot \frac{r'}{\omega}$$

Similarly, from $(rh/2)\cdot\cot(\omega h/2) = (h/2)\cdot\cot(\omega h/2)\cos\omega kh\cdot r' - \sin\omega kh \cdot l'$, $$r = \cos\omega kh \cdot r' - \omega\sin\omega kh \cdot l' \tag{22}$$

Thus, three contiguous voltage data points and three contiguous current data points close to the respective peak values are used to obtain the false resistance $r'$ and the false inductance $l'$, and the known quantities $\sin\omega kh$ and cos ωkh are used to determine the resistance r and the inductance 1. Therefore, the quantization error effect can be minimized.

A method of searching for a peak value, which is an important feature of the invention, will be described.

Figure 3:
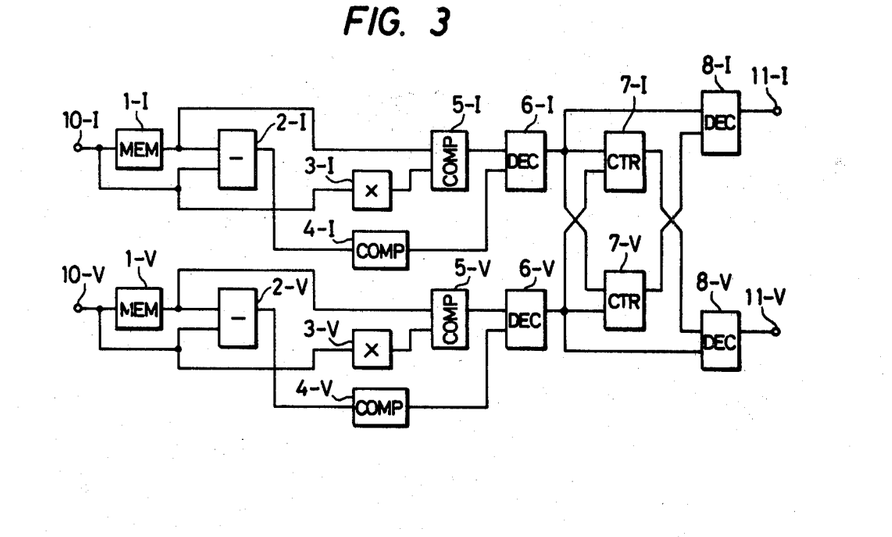
FIG. 3 is a block diagram showing one example of a circuit for practicing a method according to the invention.

FIG. 3 is a block diagram showing an example of a circuit for detecting in a matter of sampling time widths a peak value of a voltage or current and the phase difference thereof. In FIG. 3, reference numeral 1 designates a memory circuit, 2 a subtraction circuit, 3 a multiplication circuit, 4 and 5 comparison circuits, 6 a decision circuit, 8 a general decision circuit, 10 an input terminal, and 11 an output circuit. The characters "I" and "V" suffixed to these reference numerals indicate circuit elements on the current side and on the voltage side, respectively.

The operation of the circuit shown in FIG. 3 will be described mainly with respect to the current side. It is assumed that when a data point $i_n$ corresponding to the n-th sampling point is applied to the input terminal 10, a data $i_{n-1}$ point is provided at the output of the memory circuit 1. In the subtraction circuit 2, accordingly a calculation of $i_n - i_{n-1}$ is carried out. The output of the subtraction circuit 2 is applied to a comparison circuit where it is determined whether the output is positive, negative or zero according to the sign of the following expression (30):

$$i_n - i_{n-1} = 2I \sin \frac{\omega h}{2} \cos\omega \left( t - \frac{h}{2} \right) . \tag{30}$$

The determination result is outputted.

In the comparison circuit 5, the following expression (31) is evaluated using the output $(2 \cos \omega h - 1) i_n$ from the multiplication circuit 3 and the output $i_{n-1}$ from the memory circuit 1:

$$(2\cos\omega h - 1) \cdot i_n - i_{n-1} = 2I \cdot \sin \frac{\omega h}{2} \cos\omega \left( t + \frac{h}{2} \right) . \tag{31}$$

That is, the calculation is carried out using data points which are earlier by one sampling period than those for the expression (30). Accordingly, the comparison circuit 5 outputs a positive, negative or zero result.

Figure 4:
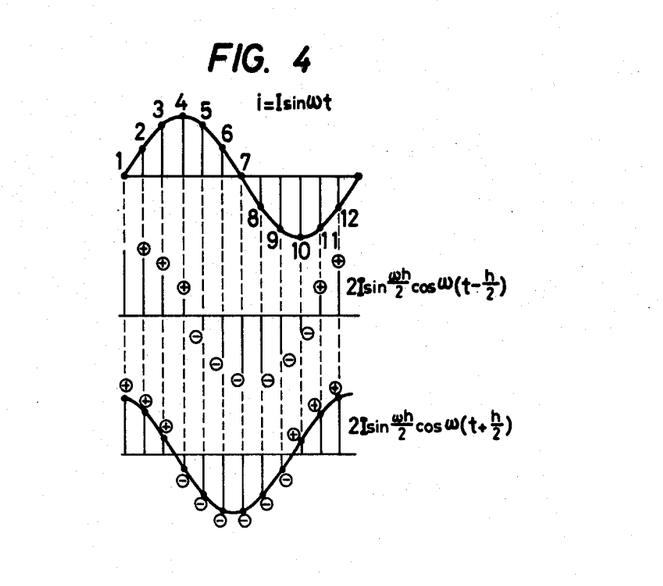
FIG. 4 is an explanatory diagram for a description of the operating principle of the circuit shown in FIG. 3.

In the decision circuit 6, the outputs of the comparison circuits 4 and 5 are subjected to logical decision. FIG. 4 is a waveform diagram for a description of the decision principle of the decision circuit 6. In FIG. 4, the upper part shows an input waveform ($i = I \sin \omega t$), the middle part shows a waveform represented by the expression (30), and the lower part shows a waveform represented by the expression (31). Numerals 1 through 12 on the waveform in the first part represent sampling numbers. In FIG. 4, the peak point coincides with sampling number 4. This indicates the presence of a peak point when, in the successive evaluation of the expression (30), the sign changes from positive to negative or vice versa. Furthermore, in the successive evaluation of the expression (31), the presence of a peak point is indicated when the sign changes similarly. In the middle part of the figure, the sign of the data point for sampling number 4 is opposite to that of the data point for sampling number 5, while in the lower part, the signs of the data of sampling numbers 3 and 4 are opposite one another. Thus, it can be understood that the peak point falls in a range of time defined by adding periods of time ±h/2 to the time instant indicated by sampling number 4 which is located between sampling numbers 3 and 5. Coefficient multiplication of the expression (31) is carried out to select the peak point as an intermediate sampling number between the sampling numbers at which the sign changes in the middle and lower parts. In this case, the peak point falls between the zero points shown in the middle and lower parts.

If the decision circuit 6 receives equal-sign outputs from the comparison circuits 4 and 5 at any time, depending on the sampling start time with respect to an input waveform, the peak point falls between the equal-sign outputs.

Without the zero point outputs from the comparison circuit, the peak point can be detected from the change of sign. That is, the peak point is present immediately before the output of the comparison circuit 4 changes from positive to negative or vice versa or immediately after the output of the comparison circuit 5 changes from positive to negative or vice versa.

In this case, it is possible to detect the peak point from the change of sign by individually using the expressions (30) and (31). However, in the method of the invention in which the conditions of both of the expressions (30) and (31) are utilized to positively detect the presence of the peak point in conformance with a conventional electric power system protection control such that unnecessary output is eliminated as far as possible, since it is unnecessary to set the sampling start timing constant at all times, it can be determined theoretically that the peak point falls in a period of time which is ±h/2 from the peak point of an input waveform.

In general, upon occurrence of a fault condition in a transmission line, the phase of the voltage leads that of the current. During the presence of the fault condition the decision circuit 6-V detects a sampling number indicating the peak point. The output of the decision circuit 6-V, which may be a signal the level of which changes from a high logic level to a low logic level or vice versa, is applied to counter circuits 7-I and 7-V and the number of sampling times is counted according to the sampling period. In this case, the operation of the counter 7 is stopped by the output signal of the decision circuit 6-I, which is assumed to lag in phase. Thus, it can be detected how many sampling numbers correspond to the distance between the peak points of the voltage and the current.

In this case, the distance between the peak points can be obtained with an accuracy of $(\pi h/2)+(\omega h/2)$ radians $(N=0, 1, \ldots)$, which sufficiently satisfies the above-stated object of reducing the quantization error.

The general decision circuit 8, after receiving the output of the counter 7, carries out a general decision process with the output of the decision circuit (6-I in this case) which lags in phase. With the current employed as a reference, the leading angle $\theta$ of the voltage can be subjected to phase discrimination in the range of $0° < \theta < 180°$.

As is apparent from the technical concept indicated in FIG. 3, in the case of an angle $\alpha$ with $0° < \theta < 180°$, it is difficult to discriminate angles $\alpha$ and $\alpha + 180°$. When a fault occurs in a transmission line, in general, the phase of the voltage leads, but by not more than 90°. Therefore, with $0° < \theta < 180°$, no difficulties arise on this account. However, if arcing occurs at a nearby point, the position of the fault point may be projected on the R-axis in R-jX coordinates. Therefore, in practicing the method of the invention, it is possible to carry out the phase discrimination even when the angle $\theta$ is negative. It is preferable that the arrangement operate under the condition of $-90° < \theta < 90°$ to determine leading or lagging phase. In other words, after the sampling numbers 0 to 6 for sampling of an electrical angle 30° corresponding to 0 to $\pi/2$ radians are detected, it is then determined that the decision circuit 8-I lags, and when the samping numbers 3 to 5 corresponding to $-\pi/2$ to 0 radians are detected, it is determined that the decision circuit 8-V lags.

In accordance with the invention, not only the value of the data point k, but also whether the data point k is lagging or leading must be taken into account. When the voltage leads the current, the data point k acts as a voltage sampling data point "$-k$", and when the voltage lags the current, it acts as a voltage sampling data point "$+k$". In the latter case, the data point k can be employed as a current sampling data point "$-k$".

Figure 5:
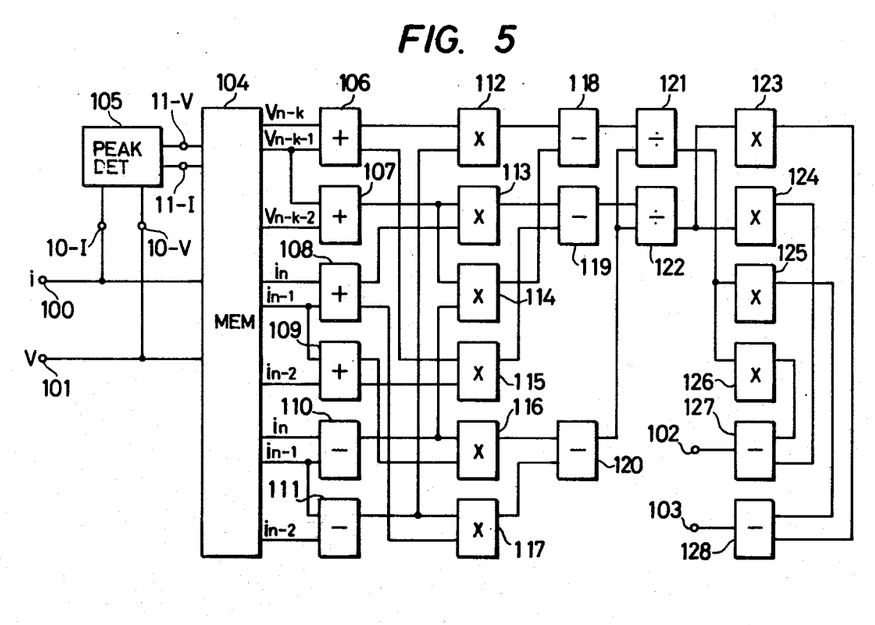
FIG. 5 is a block diagram showing a specific example of an apparatus constructed in accordance with the invention including the circuit shown in FIG. 3.

FIG. 5 shows a specific embodiment of an apparatus the invention. In FIG. 5, reference numeral 100 designates a current input terminal, 101 a voltage input terminal, 102 and 103 output terminals, 104 a data memory section, 105 a peak value detecting section similar to that shown in FIG. 3, 106 through 109 addition circuits, 110 and 111 subtraction circuits, 112 through 117 multiplication circuits, 118 through 120 subtraction circuits, 121 and 122, division circuits, 123 through 126 multiplication circuits, and 127 and 128 subtraction circuits.

The apparatus shown in FIG. 5 operates as follows. For simplification in description, it is assumed that the inputs as shown in FIG. 2 are applied to the input terminals 100 and 101. When the data points $v_{n-5}$ through $v_{n-3}$ are applied to the peak value detecting section 105, the section 105 detects that the voltage peak value is $v_{n-4}$. In the peak value detecting section, introduction of the data is advanced, and it can be detected from the data $i_{n-2}$ through $i_n$ that the current peak value is $i_{n-1}$, and it is detected that three sampling intervals (i.e. k=3) fall between the voltage and current peaks. The data memory section 104 is used to store data necessary for calculation. In this case, the data memory section 104 stores at least the current data $i_{n-5}$ through $i_n$ and the voltage data $v_{n-5}$ through $v_n$.

The addition circuits 106 through 106 provide addition results $v_{n-k}+v_{n-k-l}$, $v_{n-k-l}+v_{n-k-2}$, $i_n+i_{n-1}$ and $i_{n-1}+i_{n-2}$, respectively. The subtraction circuits 110 and 111 provide subtraction results $i_n-i_{n-1}$ and $i_{n-1}-i_{n-2}$, respectively.

The multiplication circuits 112 through 117 provide multiplication results: $(v_{n-k}+v_{n-k-1})(i_{n-1}-i_{n-2})$, $(v_{n-k-1}+v_{n-k-2})(i_n+i_{n-1})$, $(v_{n-k-1}+v_{n-k-2})(i_n-i_{n-1})$, $(v_{n-k}+v_{n-k-1})(i_{n-1}+i_{n-2})$, $(i_{n-1}+i_{n-2})(i_n-i_{n-1})$ and $(i_n+i_{n-1})(i_{n-1}-i_{n-2})$, respectively.

The subtraction circuits 118 through 120 provide subtraction results:

$$(v_{n-k} + v_{n-k-1})(i_{n-1} - i_{n-2}) -$$
$$(v_{n-k-1} + v_{n-k-2})(i_n - i_{n-1}) \text{ and}$$
$$(i_n + i_{n-1})(v_{n-k-1} + v_{n-k-2}) -$$
$$(i_{n-1} + i_{n-2})(v_{n-k} + v_{n-k-1}), \text{ and}$$
$$(i_n + i_{n-1})(i_{n-1} - i_{n-2}) -$$
$$(i_{n-1} + i_{n-2})(i_n - i_{n-1}), \text{ respectively.}$$

The division circuits 121 and 122 provide division results:

$$\frac{(v_{n-k} + v_{n-k-1})(i_{n-1} - i_{n-2}) - (v_{n-k-1} + v_{n-k-2})(i_n - i_{n-1})}{(i_n + i_{n-1})(i_{n-1} - i_{n-2}) - (i_{n-1} + i_{n-2})(i_n - i_{n-1})}, \text{ and}$$

$$\frac{(i_n + i_{n-1})(v_{n-k-1} + v_{n-k-2}) - (i_{n-1} + i_{n-2})(v_{n-k} + v_{n-k-1})}{(i_n + i_{n-1})(i_{n-1} - i_{n-2}) - (i_{n-1} + i_{n-2})(i_n - i_{n-1})} \times \frac{h}{2}, \text{ respectively.}$$

The multiplication circuits 123 through 126 provide multiplication results:

$$\frac{(i_n + i_{n-1})(v_{n-k-1} + v_{n-k-2}) - (i_{n-1} + i_{n-2})(v_{n-k} + v_{n-k-1})}{(i_n + i_{n-1})(i_{n-1} - i_{n-2}) - (i_{n-1} + i_{n-2})(i_n + i_{n-1})} \times \frac{h}{2} \times \cos\omega kh,$$

$$\frac{(i_n + i_{n-1})(v_{n-k-1} + v_{n-k-2}) - (i_{n-1} + i_{n-2})(v_{n-k} + v_{n-k-1})}{(i_n + i_{n-1})(i_{n-1} - i_{n-2}) - (i_{n-1} + i_{n-2})(i_n - i_{n-1})} \times \frac{h}{2} \times (-\omega\sin\omega kh),$$

$$\frac{(v_{n-k} + v_{n-k-1})(i_{n-1} - i_{n-2}) - (v_{n-k-1} + v_{n-k-2})(i_n - i_{n-1})}{(i_n + i_{n-1})(i_{n-1} - i_{n-2}) - (i_{n-1} + i_{n-2})(i_n - i_{n-1})} \times \frac{\sin\omega kh}{\omega}, \text{ and}$$

$$\frac{(v_{n-k} + v_{n-k-1})(i_{n-1} - i_{n-2}) - (v_{n-k-1} + v_{n-k-2})(i_n - i_{n-1})}{(i_n + i_{n-1})(i_{n-1} - i_{n-2}) - (i_{n-1} + i_{n-2})(i_n - i_{n-1})} \times \cos\omega kh, \text{ respectively.}$$

The subtraction circuits 127 and 128 provide subtraction results:

$$\frac{(v_{n-k} + v_{n-k-1})(i_{n-1} - i_{n-2}) - (v_{n-k-1} + v_{n-k-2})(i_n - i_{n-1})}{(i_n + i_{n-1})(i_{n-1} - i_{n-2}) - (i_{n-1} + i_{n-2})(i_n - i_{n-1})} \times \cos\omega kh -$$

$$\frac{(v_n + i_{n-1})(v_{n-k-1} + v_{n-k-2}) - (i_{n-1} + i_{n-2})(v_{n-k} + v_{n-k-1})}{(i_n + i_{n-1})(i_{n-1} - i_{n-2}) - (i_{n-1} + i_{n-2})(i_n - i_{n-1})} \times \frac{h}{2} \times (\omega\sin\omega kh), \text{ and}$$

$$\frac{(i_{n-1} + i_{n-2})(v_{n-k} + v_{n-k-1}) - (i_n + i_{n-1})(v_{n-k-2} + v_{n-k-1})}{(i_n + i_{n-1})(i_{n-1} - i_{n-2}) - (i_{n-1} + i_{n-2})(i_n - i_{n-1})} \times \cos\omega kh -$$

-continued $$\frac{(v_{n-k-2} + v_{n-k-1})(i_n - i_{n-1}) - (v_{n-k-1} + v_{n-k})(i_{n-1} + i_{n-2})}{(i_n + i_{n-1})(i_{n-1} - i_{n-2}) - (i_{n-1} - i_{n-2})(i_n - i_{n-1})} \times \frac{h}{2} \times \sin\omega kh, \text{ respectively.}$$

Thus, the resistance and the inductance are provided at the output terminals 102 and 103, respectively.

As is apparent from the above description, in accordance with the invention, three contiguous voltage data points close to the voltage peak value and three contiguous current data points close to the current peak value are used to obtain the resistance and the inductance, whereby the effect of the quantization error in the low input range and near the zero point is reduced. The method of the invention should be practiced in combination with a fault detecting element and a time delay element because, as taught by the above-described peak point detecting method, peak point detection error may occur if the waveform is abruptly changed by an abrupt change of the load or the occurrence of a fault in the transmission line.

Figure 6A:
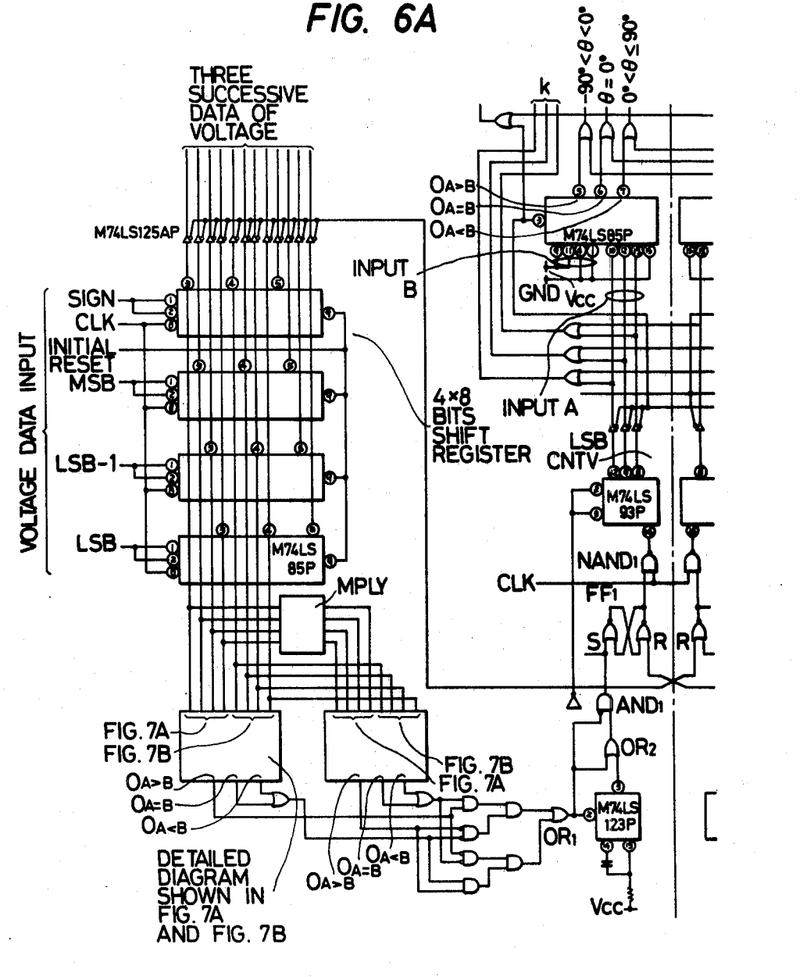
FIGS. 6A and 6B are a detailed circuit diagram of the circuit shown in block diagram form in FIG. 3.
Figure 6B:
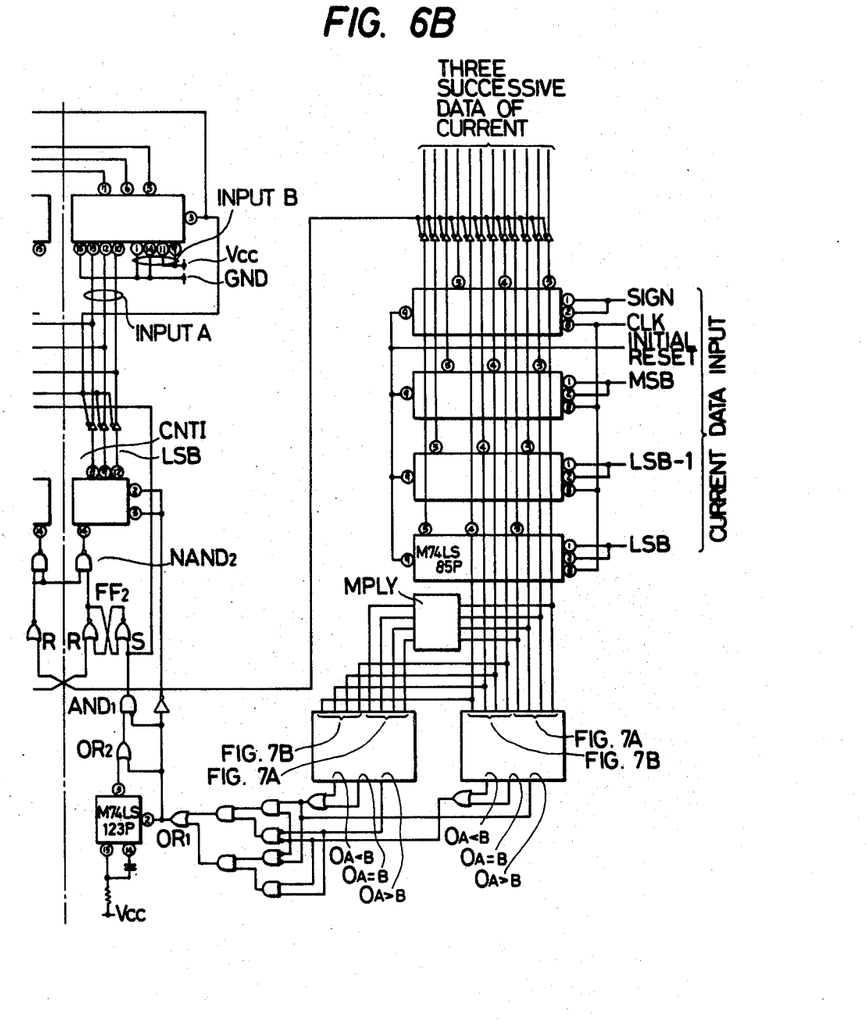

FIG. 6 is a detailed circuit diagram of the apparatus shown in block diagram form in FIG. 3. A circuit shown in FIG. 6 is composed of 8-bit serial-in parallel-out shift register, dual retriggerable monostable multivibrators with reset, quadruple bus buffer gates with 3-state output, 4-bit magnitude comparators, 4-bit binary counters, multiplexers, 4-bit binary full adders, inverters and NAND/AND/NOR/OR gates.

Figures 7A, 7B:
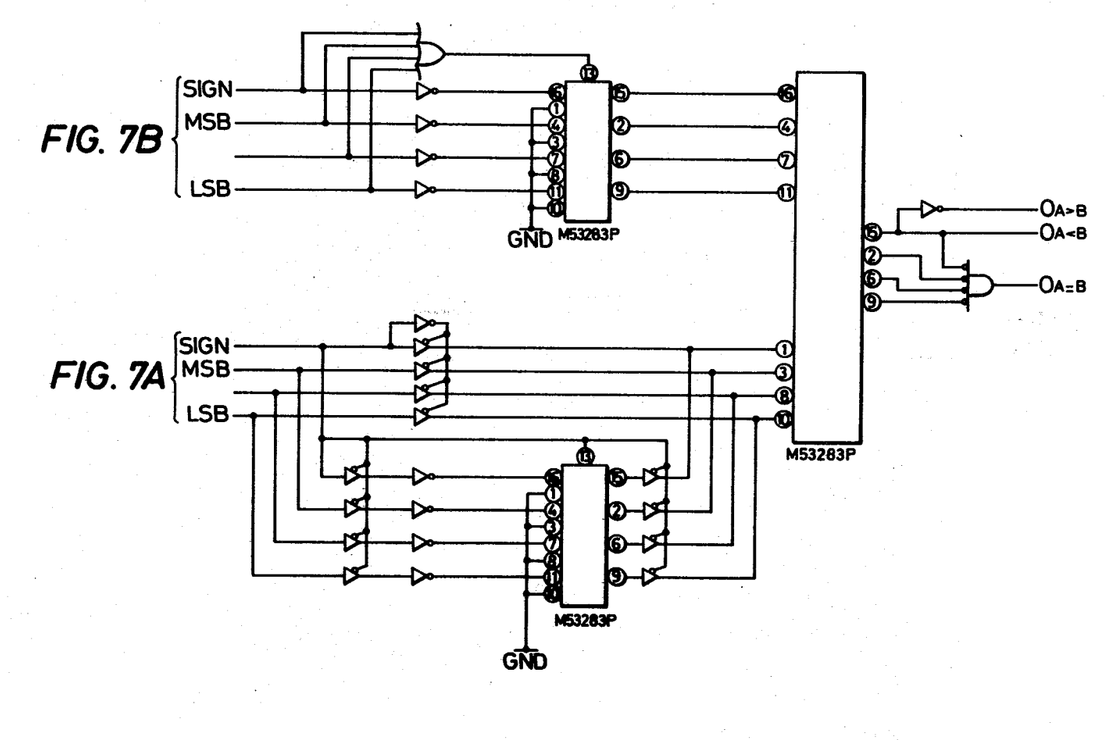
FIGS. 7A and 7B are detailed diagrams each showing a part of the circuit of FIG. 6.

FIG. 7A and FIG. 7B are detailed diagrams each showing a part of the circuit of FIG. 6.

In FIG. 6, a circuit with a 4-bit construction is shown to make the circuit construction easier to understand. In this case, using known digital techniques, the circuit construction can readily be extended to a desired bit number.

The circuit shown in FIG. 6 operates to produce three successive data points of voltage and three successive data points of current in the vicinity of the respective peak values and to discriminate a difference in the number of sampling between the above data points and leading or delaying in the above data points.

The difference k in the number of sampling points due to a leading angle of the voltage with reference to the current is shown in the following table.

| Leading angle of V | CNTV | CNTI |
| --- | --- | --- |
| 0 | 0 | 0 |
| 30 | 1 | 5 |
| 60 | 2 | 4 |
| 90 | 3 | 3 |
| 120 | 4 | 2 |
| 150 | 5 | 1 |
| 180 | 0 | 0 |
| 270 | 3 | 3 |
| 300 | 4 | 2 |

What is claimed is:

1. An apparatus for detecting a current peak value and a voltage peak value in a power line system comprising:

first memory means for storing values representing a digital current signal obtained by sampling a current flowing through said power line system at a predetermined time interval; first subtracting means for determining a difference between a present current sampling data point value and a current sampling data point value corresponding to a sampling time prior to said present current sampling data point and stored in said first memory means; first multiplication means for determining a product of said present sampling data point value and a first constant; first comparing means for comparing a product output of said first multiplication means and a content of said first memory means; first decision means for detecting changes of signs in said outputs of said first comparison means and said first subtracting means; second memory means for storing values representing a digital voltage signal obtained by sampling a voltage on said power line system at said predetermined time interval; second subtracting means for determining a difference between a value of a present voltage sampling data point and a value of a voltage sampling data point one sampling time prior to said present voltage sampling data point and stored in said first memory means; second multiplication means for determining a product of said value of said present voltage sampling data point and a second constant; second comparing means for providing a second comparison result between a product output of said second multiplication means and a content of said second memory means; second decision means for detecting changes of signs in said outputs of said second comparing means and said second subtracting means; first counting means made operable to start counting sampling intervals in response to an output of said first decision means and to stop counting said sampling intervals in response to an output of said second decision means; second counting means made operable to start counting said sampling intervals in response to said output of said second decision means and to stop counting said sampling intervals in response to said output of said first decision means; third decision means for providing an output representative of the number of sampling intervals counted between termination of the counting operation of said second counting means and an initial output of said first decision means; and fourth decision means for providing an output representative of the number of samplings counted between termination of the counting operation of said first counting means and an initial output of said second decision means.

2. The apparatus as defined in claim 1 wherein said outputs of said first and second multiplication means are in the form of 2cos (ωh−1), where ω is an angular frequency in said power line system and h is a sampling interval.

3. The apparatus as defined in claim 1 wherein said sampling interval corresponds to an electrical angle of 30° in said power line system.

4. A method for determining a location of a fault in a power line system by determining values of a resistance r and an inductance l between a measurement point and said fault, comprising the steps of:

(1) sampling at a predetermined sampling interval h a voltage and a current on said power line system at said measurement point to provide first and second sequences of voltage and current data point values, respectively;

(2) determining from said first and second sequences peaks of said voltage and current;
(3) determining a number k of said sampling intervals h between said peaks of said voltage and current;
(4) calculating a value of a false inductance l' in accordance with:

$$l' = Z \cdot [\sin(\theta - \omega k h)] \cdot \frac{h}{2} \cdot \cos\left(\frac{\omega h}{2}\right),$$

where $Z = V/I$ with V being a peak value of said voltage and I being a peak value of said current, $\omega$ is an angular frequency of said current and voltage, $\theta$ is a reference phase angle;
(5) calculating a value of a false resistance r' in accordance with:

$$r' = Z \cdot [\cos(\theta - \omega k h)];$$

(6) calculating said value of said inductance in accordance with:

$$l = [\cos(\omega k h)] \cdot l' + [\sin(\omega k h)] \cdot \frac{r'}{\omega}; \text{ and}$$

(7) calculating said value of said resistance r in accordance with:

$$r = [\cos(\omega w h)] \cdot r' - \omega \cdot [\sin(\omega k h)] \cdot l'.$$

5. The fault locating method of claim 4, wherein said step (2) of determining said peaks of said voltage and current comprises: storing digital values representing a current signal by sampling a current flowing through said power line system at a predetermined time interval; determining as a first difference a difference between a present current sampling data point value and a current sampling data point value corresponding to a sampling time prior to a present sampling time; determining as a first product a product of said present current sampling data point value and a first constant; comparing said first product and said present current sampling data point value to produce a first comparison value; detecting changes of signs in said first difference and said first comparison value; storing digital values representing a voltage signal obtained by sampling a voltage on said power line system at said predetermined time interval; second subtracting means for determining as a second difference a difference between a value of a present voltage sampling data point and a value of a voltage sampling data point one sampling time prior to said present sampling time; determining as a second product a product of said value of said present voltage sampling data point and a second constant; comparing said second product and said present current sampling point value to produce a second comparison value; detecting changes of signs in said second difference and said second comparison value; starting counting sampling intervals in response to a result of said first detecting step and ceasing counting sampling intervals in response to a result of said second detecting step; starting counting sampling intervals in response to said result of said second detecting step and ceasing counting timing intervals in response to said second detecting step; providing an output representative of a number of sampling intervals counted between cessation of said second counting step and an initial count of said first counting step; and providing an output representative of a number of sampling intervals counted between cessation of said first counting step and an initial count of said second counting step.

* * * * *